United States Patent [19]

Kamada

[11] Patent Number: 5,140,407
[45] Date of Patent: Aug. 18, 1992

[54] SEMICONDUCTOR INTEGRATED CIRCUIT DEVICES

[75] Inventor: Chiyoshi Kamada, Kokubunji, Japan
[73] Assignee: Hitachi, Ltd., Tokyo, Japan
[21] Appl. No.: 617,357
[22] Filed: Nov. 23, 1990

[30] Foreign Application Priority Data

Dec. 25, 1989 [JP] Japan ................... 1-336032

[51] Int. Cl.$^5$ ............... H01L 23/02; H01L 27/02; H01L 23/48; H01L 23/16
[52] U.S. Cl. ........................... 357/74; 357/51; 357/68; 357/75
[58] Field of Search ............... 357/74, 51, 68, 75

[56] References Cited

FOREIGN PATENT DOCUMENTS 0176153  8/1987  Japan .
0107129  5/1988  Japan .
0256001 10/1988  Japan .
0256002 10/1988  Japan .
0258046 10/1988  Japan .

OTHER PUBLICATIONS

Nikkei Microdevices, pp. 111–117, Nov. 1985 by McGraw Hill.

*Primary Examiner*—Mark V. Prenty
*Attorney, Agent, or Firm*—Antonelli, Terry, Stout & Kraus

[57] ABSTRACT

In a superhigh speed device driven by GHz band frequencies, a semiconductor integrated circuit device is provided, in which an adjusting impedance is arranged in the inside of a high frequency package accommodating a semiconductor chip to compensate for the mismatching between the characteristic impedance of the package wiring and the terminal impedance of the signal transmission line in the package in order to adjust the input impedance to the characteristic impedance of the signal transmission line.

17 Claims, 8 Drawing Sheets

SEMICONDUCTOR INTEGRATED CIRCUIT DEVICES

BACKGROUND OF THE INVENTION

The present invention relates to semiconductor integrated circuit devices, and more particularly to a technique of adjusting impedance of signal transmission wirings for superhigh speed devices.

For a superhigh speed device such as GaAs (gallium arsenide) IC operating with frequencies in a GHz band, it is necessary to adjust the input impedance to the characteristic impedance of the signal transmission line thereof. This adjustment is required because there is a possibility that circuit malfunctions due to signal reflection and waveform distortion would result if the above-mentioned high impedances are not matched in transmitting high frequency signals. There is also a possibility that circuit malfunctions due to signal reflection and waveform distortion would result if the characteristic impedance of the signal transmission line mentioned above is not matched to the impedance at its terminal. For these reasons, in an IC package in which a superhigh speed device is mounted for example, the value of the characteristic impedance of the package wiring is made to match that of the impedance of the signal source and at the same time, the impedance of the signal transmission line in the package is adjusted by arranging a load resistance for adjusting the impedance at the terminal of the package wiring.

Figure 11:
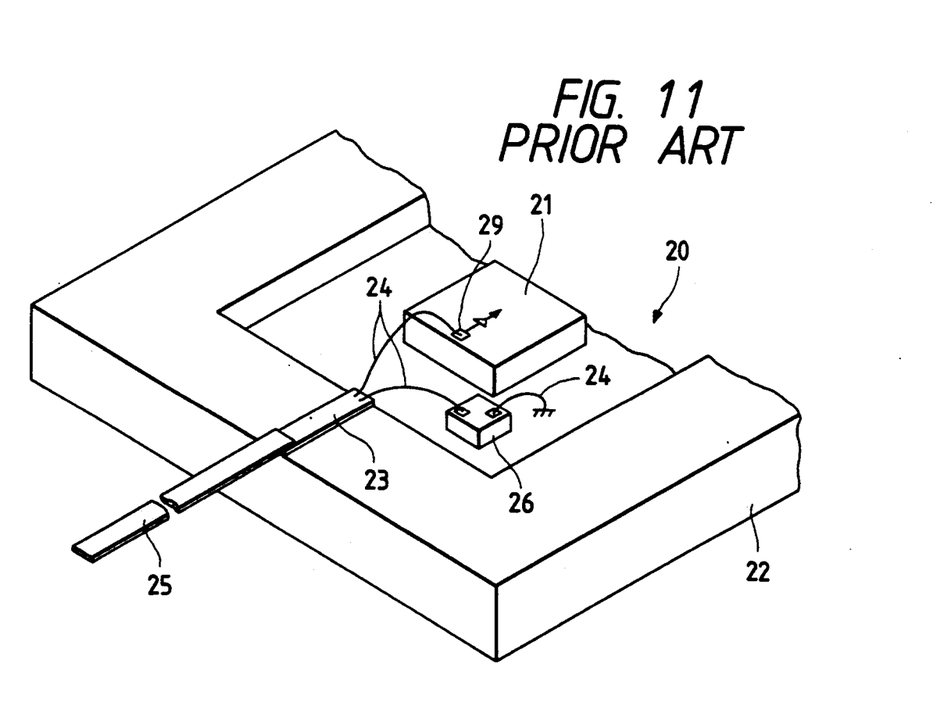
FIG. 11 to FIG. 13 are perspective views showing the principle parts of convention semiconductor integrated circuit devices.
Figure 12:
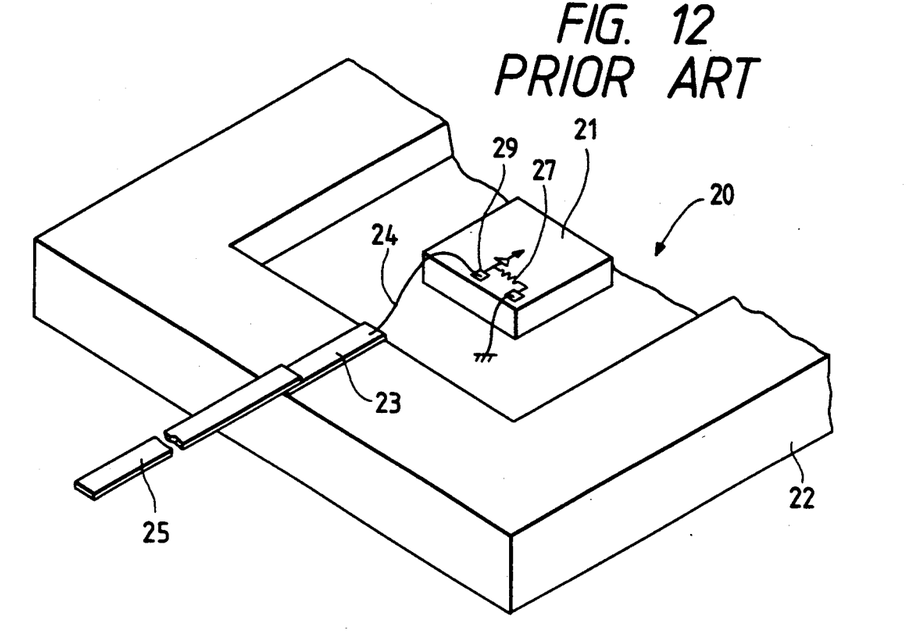
Figure 13:
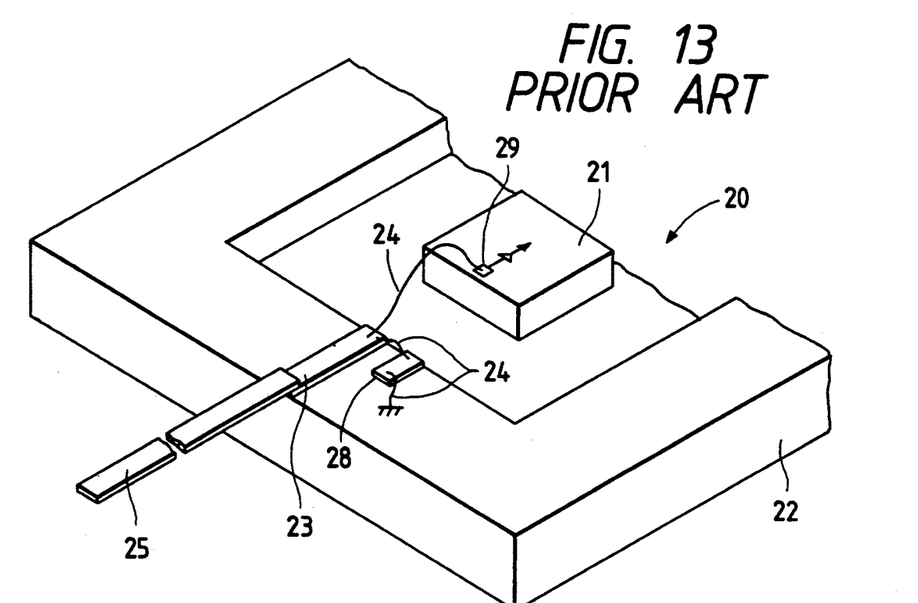

FIG. 11 through FIG. 13 are views showing the specific examples of the above-mentioned terminal resistance. In these figures, a semiconductor chip 21 is mounted in the cavity of an IC package 20 made of ceramics, and on the outer circumference of a substrate 22, a package wiring 23 is formed. A plurality of the above-mentioned package wirings 23 are mounted along the outer circumference of the substrate 22. (By outer circumference it is meant to include an outer area of the package substrate 22 which surrounds the cavity of the IC package, the cavity corresponding to a central area of the package. In these figures, however, only one of the wirings is shown for convenience' sake. The semiconductor chip 21 and the package wiring 23 are connected through a bonding wire 24, and an outer lead 25 is brazed to the other end of the package wiring 23. FIG. 11 is a view showing an example of a structure in which the terminal resistance is produced by a chip resistance 26 mounted in the cavity. One end of the above-mentioned chip resistance 26 is connected to the package wiring 23 through the bonding wire 24 while the other end thereof is connected to the grounding potential (GND) through the bonding wire 24. On the other hand, FIG. 12 is a view showing an example of a structure in which the terminal resistance is produced by a resistance element 27 in the semiconductor chip 21. Also, FIG. 13 is a view showing an example of a structure in which the terminal resistance is produced by a thick film resistance 28 formed on the substrate 22. In this respect, there is, for example, an article regarding a technique for adjusting impedance of the IC package for superhigh speed devices in "Nikkei Microdevices" pp.111 to 117 published in Nov. , 1985 by Nikkei-McGraw Hill Inc. Also, there are, for example, disclosures regarding the IC package in which a load resistance is mounted for adjusting impedance at the terminal of the package wiring in Japanese Patent Laid-Open No. 176153/1987, Japanese Patent Laid-Open No. 107129/1988, Japanese Patent Laid-Open No. 256001/1988, Japanese Patent Laid-Open No. 256002/1988, Japanese Patent Laid-Open No. 258046/1988, etc.

Figure 14:
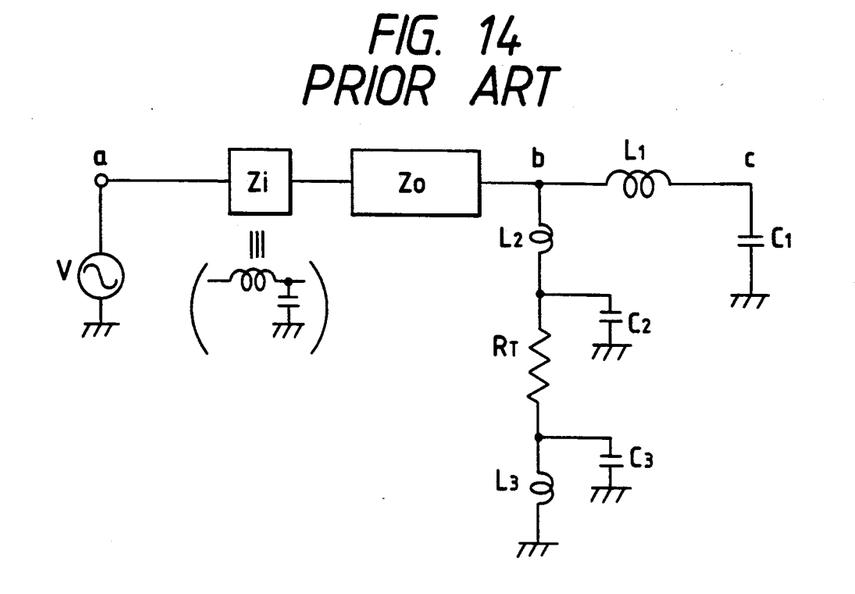
FIG. 14 and FIG. 15 are circuit diagrams showing the transmission lines in packages of the convention semiconductor integrated circuit devices.

Summary of the Invention:

However, since the outer lead, bonding wire, etc. are connected to the package wiring in an actual IC package, there exist parasitic elements (inductance, capacitance, and resistance) at these connections. For example, FIG. 14 is a circuit diagram of the signal transmission line in the package shown in FIG. 11 mentioned earlier, in which a point a is the leading edge of the outer lead, a point b is one end of the package wiring (the side to which the bonding wire is connected), and a point c is the starting point of the input circuit in the semiconductor chip. A mark $Z_0$ denotes the characteristic impedance of a package wiring, and a mark $R_T$ denotes the terminal resistance. Both of them are set to be matched to the value of the inner impedance of a signal source v (50 Ω for example). The major parasitic elements formed in the above-mentioned signal transmission line in the package are $Z_i$, $L_1$-$L_3$, $C_1$-$C_3$, etc. The mark $Z_i$ denotes the package input parasitic impedance resulting from the inductance, capacitance, and resistance of the outer lead and package wiring, and $L_1$-$L_3$ are the parasitic inductance of the bonding wire and wiring in the semiconductor chip, and $C_1$-$C_3$ are the parasitic capacitance of the bonding wire and the input parasitic capacitance of the semiconductor chip. Also, in FIG. 15, an example of the specific values of the above-mentioned parasitic elements ($Z_i$, $L_1$-$L_3$, $C_1$-$C_3$) obtained by simulating the signal transmission line in the package mentioned above.

Figure 6:
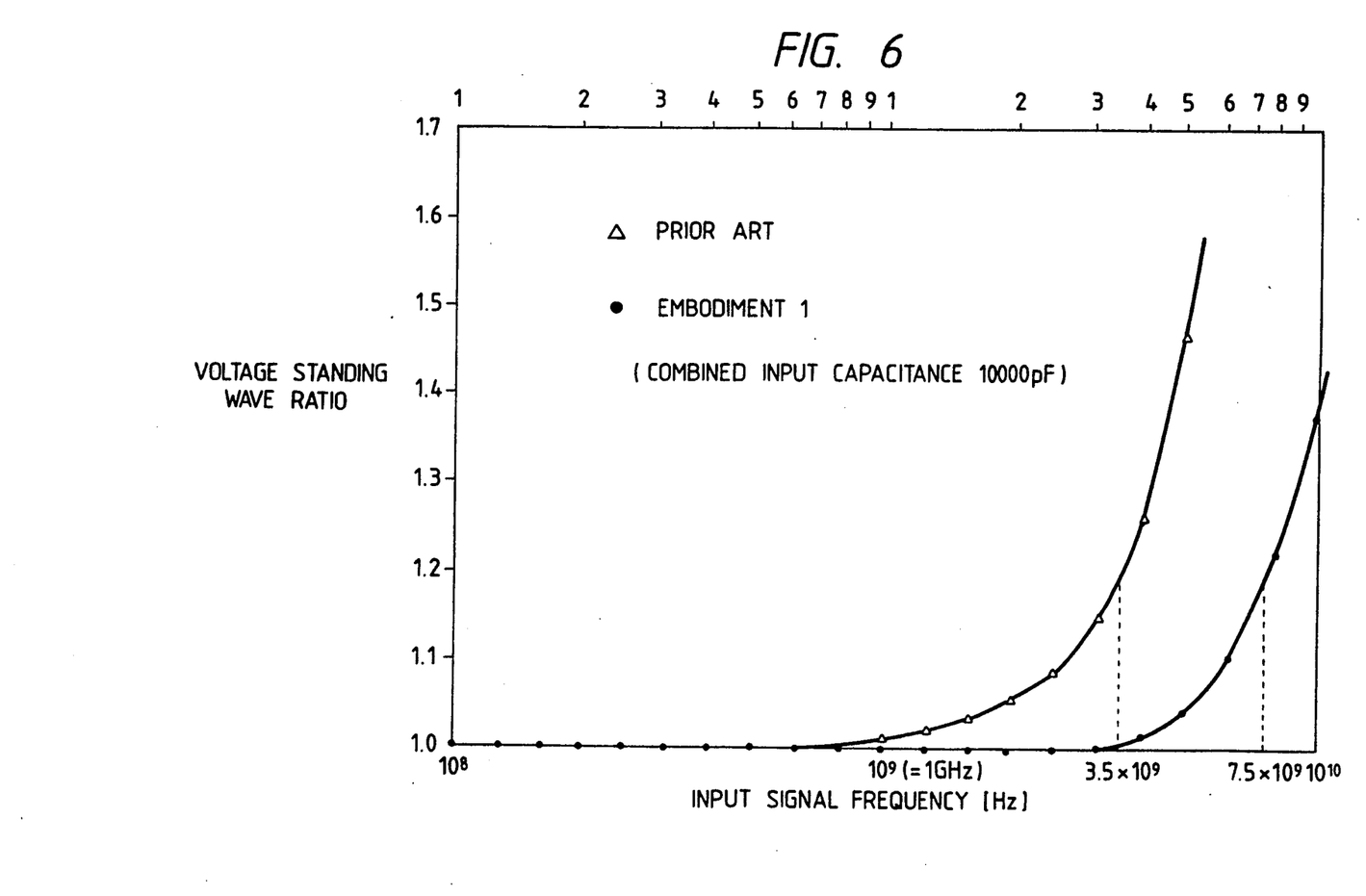
FIG. 6 is a graphic diagram showing the voltage standing wave ratios for the transmission line in the package according to this embodiment and prior art.

The reactance (X) which is the imaginary number of an impedance (Z) is the function of a frequency, and the greater its value is, the higher is the frequency ($X=\omega L - 1/\omega C$; $\omega = 2\pi f$). Therefore, the higher the operating frequency of an IC is, the more conspicuous is the impedance mismatching of the signal transmission line in the package resulting from the reactance of the parasitic elements mentioned above. For example, a curved line with marks Δ shown in FIG. 6 shows the impedance mismatching degrees of the signal transmission line shown in FIG. 15 mentioned earlier, which are represented as voltage standing wave ratio (VSWR) at the point c. The above-mentioned voltage standing wave ratio is 1.0 when the value of the impedance of the signal transmission line is adjusted to the value (50ω) of the inner impedance of the signal source v perfectly. In this case, the signal transmitted from the signal source v is transferred to the point a, which is the starting point of the signal transmission line in the package, to the point c, which is the terminal thereof, without any reflection and waveform distortion. On the other hand, if the impedance mismatching degree of the signal transmission line becomes greater, the voltage standing wave ratio becomes greater than 1.0. Accordingly the signal reflection and waveform distortion become greater. As clearly seen in the figure, the voltage standing wave ratio at point c mentioned above becomes greater than 1.0 gradually in the vicinity of 1 GHz. This is caused by the greater reactance of the parasitic elements mentioned earlier resulting from the higher band of the input signal frequency. Therefore, it becomes impossible to transmit signals of approximately more than 3.5 GHz into the above-mentioned signal transmission line in the package if, for example, the standard of the voltage standing wave ratio is given to be 1.2.

Hence the conventional technique of providing the load resistance to adjust the impedance at the terminal of the package wiring has a disadvantage that the higher band of the signal frequency is restricted due to the reactance of the parasitic elements formed at the connection of the signal transmission line in the package. In order to counteract this, there is a possibility that the length of the outer lead, package wiring, bonding wire, etc. is shortened for making the reactance of the parasitic elements smaller. However, according to the assembling technique available at present, there is the limit in making their length shorter.

With the above-mentioned problems in view, the present invention is designed, and the object thereof is to provide a technique thereby reducing the impedance mismatching resulting from the reactance of the parasitic elements formed at the terminal of the signal transmission line, so that the higher band of a signal frequency can be obtained.

This and further objects, and new features of the present invention will become apparent from the description of this specification and the accompanying drawings.

The typical inventions of those to be disclosed in this application will subsequently be described briefly. In accordance with one aspect of the present invention for a semiconductor circuit device, an adjusting impedance is provided in the inside of a package accommodating a semiconductor chip to compensate for the mismatching between the characteristic impedance of the package wiring and the terminal impedance of the signal transmission line in the package.

Furthermore, there is provided a semiconductor integrated circuit device in which a resistance connected in parallel to said package line is employed with a given impedance as the above-mentioned adjusting impedance. In accordance with a further aspect of the present invention for a semiconductor integrated circuit device, an adjusting impedance is provided to compensate for the mismatching between the characteristic impedance of the wiring connecting between given circuits in a semiconductor chip and the impedance at the terminal thereof.

According to the above-mentioned means, the value of the adjusting impedance can be set in accordance with the value of the terminal impedance including the reactance of the parasitic elements formed at the terminal of the signal transmission line in the package, and providing this adjusting impedance at a given location enables the impedances of the signal transmission line in the package to be matched. Also, the bank of available signal frequencies that are transmitted into the signal transmission line in the package can be made higher.

DESCRIPTION OF PREFERRED EMBODIMENTS

[Embodiment 1]

Figure 3:
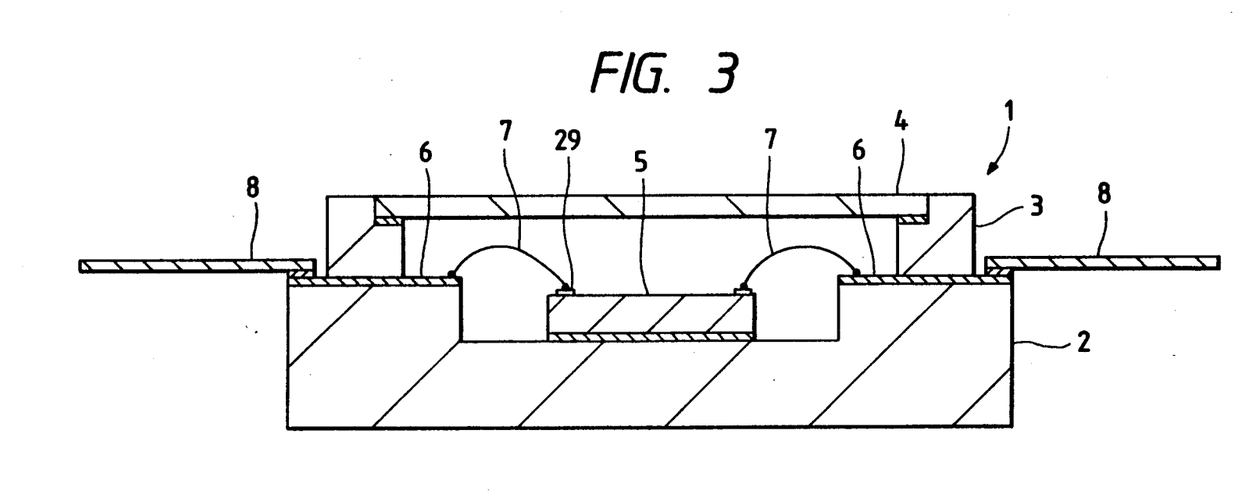
FIG. 3 is a sectional view showing this semiconductor integrated circuit device.

FIG. 3 is a sectional view showing the structure of a semiconductor integrated circuit device (IC package) according to an embodiment of the present invention. The IC package 1 is so-called ceramics package, and a GaAs semi-conductor chip 5 comprising a integrated logic circuit for performing a superhigh speed switching, for example, is mounted in the cavity of the packaging body comprising a substrate 2 made of almina, etc., a frame 3, and a cap 4. On the outer circumference of the substrate 2, the package wiring 6 printed with the thick film of W (tungsten), etc., for example, is formed. The package wiring 6 mentioned above has a characteristic impedance (50Ω in this embodiment) of the same value as the impedance of the signal source v which is not shown in FIG. 3 for driving the integrated circuit in the semiconductor chip 5. The one end of the above-mentioned package wiring 6 is connected to the semiconductor chip 5 electrically at the external terminal (bonding pad) 29 provided thereon through a bonding wire 7 made of Au, for example, and on the other end of wiring 6, an outer lead 8 made of Fe metal such as alloy 42 is brazed. In this way, the signal transmission line of the IC package 1 mentioned above is formed with the outer lead 8, package wiring 6, bonding wire 7, etc.

Figure 1:
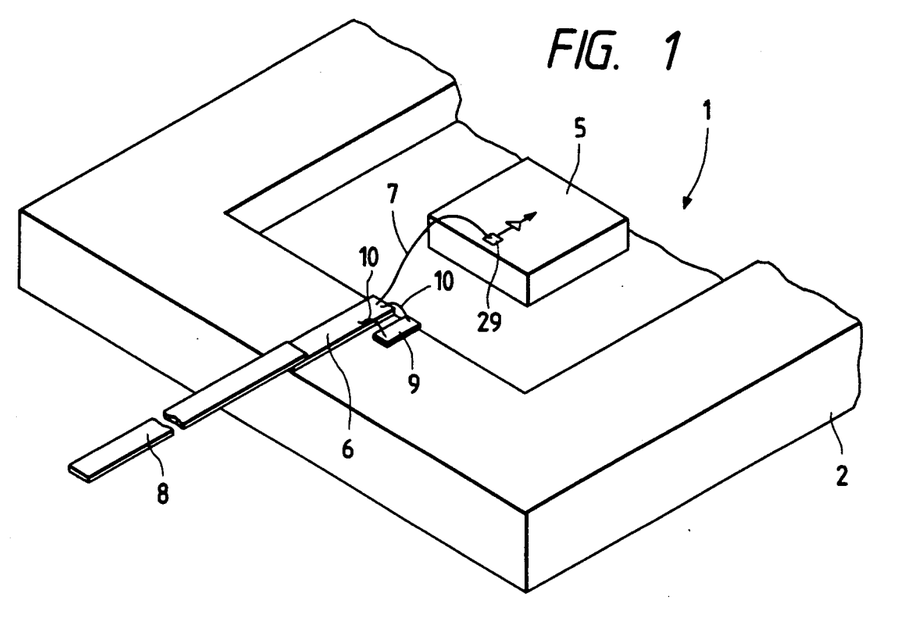
FIG. 1 is a perspective view showing the principle part of a semiconductor integrated circuit device according to one embodiment of the present invention.
Figure 2:
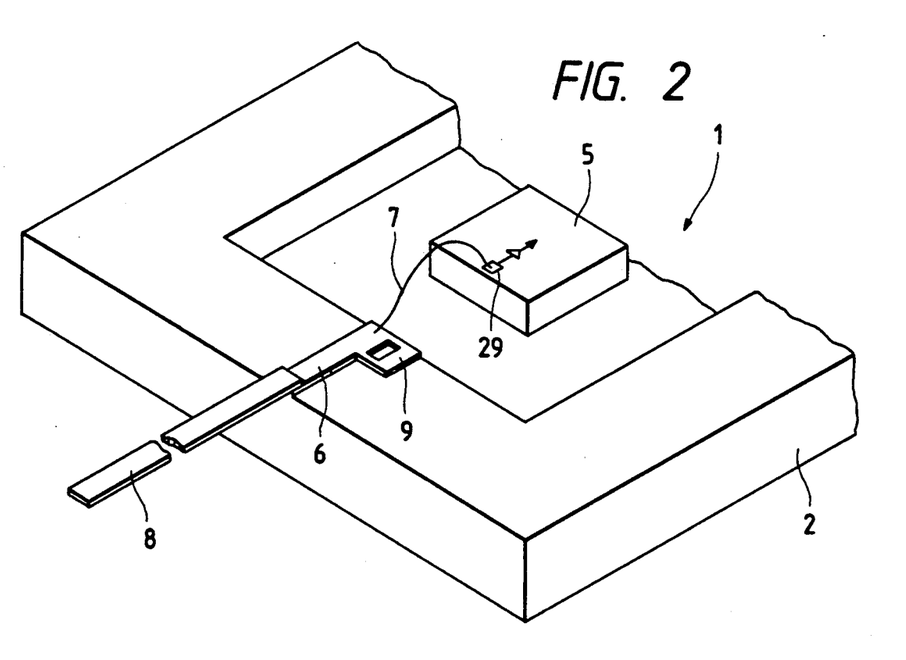
FIG. 2 is a perspective view showing the principle part of a variation of the semiconductor circuit device according to this embodiment.

As shown in FIG. 1, in the vicinity of the package wiring 6 formed on the outer circumference of said substrate 2, a thick film resistance 9 with a given impedance is arranged substantially in parallel to the above-mentioned package wiring 6. The thick film resistance 9 is an adjusting impedance to compensate for the mismatching between the characteristic impedance of the package wiring 6 and the terminal impedance of the signal transmission line which is described later. Although a plurality of package wirings 6 mentioned above are arranged along the outer circumference of the substrate 2, only one of them is shown in this figure for convenience' sake. The above-mentioned thick film resistance 9 is arranged individually in the vicinity of the package wiring 6 which transmits the input and output signals in the plurality of the package wirings 6 and is connected in parallel to the respective package wiring 6 through a bonding wire 10 made of Au for example. The above-mentioned thick film resistance 9 is formed, for example, using the same material and in the same process of making the package wiring 6. In this respect, instead of the above means of connecting the package wiring 6 and the thick film resistance 9 through the bonding wire 10, the package wiring 6 and thick film resistance 9 can be formed integrally as shown in FIG. 2 to connect both of them in parallel for example.

Figure 4:
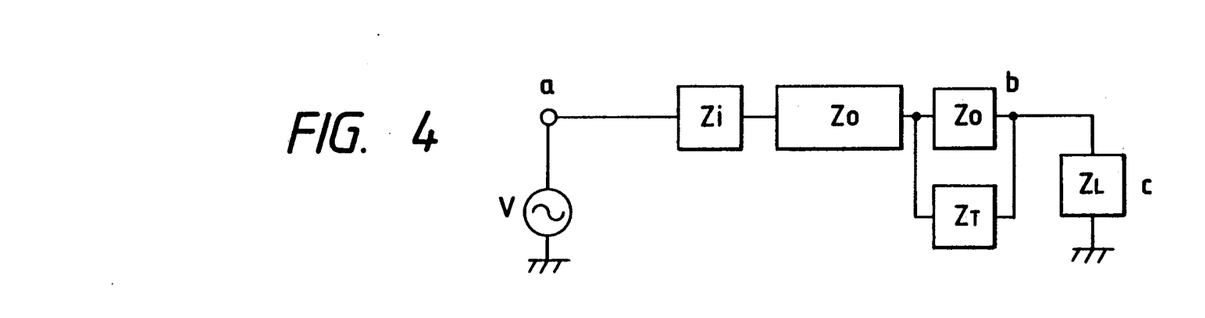
FIG. 4 and FIG. 5 are circuit diagram showing the transmission line in the package of this semiconductor integrated circuit device.

Since connections such as the outer lead 8, package wiring 6, bonding wire 7, etc. exist in the signal transmission line in the IC package 1 mentioned above, parasitic elements take place at each of these connections. Marks $Z_i$, $Z_L$ in FIG. 4 show the parasitic impedances produced by the above-mentioned parasitic elements. Here a point a in the figure is the leading edge of the outer lead 8, a point b is one end of the package wiring 6 (the side to which the bonding wire 7 is connected), and a point c is the starting point of the input circuit in the semiconductor chip 5. A mark $Z_0$ shows a characteristic impedance of the package wiring 6 ($=50\omega$), v is a signal source for driving the integrated logic circuit in the semiconductor chip 5, and $Z_T$ shows each impedance of the thick film resistance 9 connected in parallel to the package wiring 6. A mark $Z_i$ is the package input parasitic impedance produced by the inductance, capacitance, and resistance of the outer lead 8 and package wiring 6, and $Z_L$ is the terminal impedance produced by the parasitic inductance of the bonding wire 7, the parasitic inductance of the wiring in the semiconductor chip 5, the input parasitic capacitance of the semiconductor chip 5, etc.

In this embodiment 1 the mismatching ($Z_L/Z_0$) between the above-mentioned characteristic impedance of the package wiring 6 and the above-mentioned terminal impedance is compensated for by adjusting the value of the impedance $Z_T$ of the thick film resistance 9 connected in parallel to the above-mentioned package wiring 6 in accordance with the value of the above-mentioned terminal impedance $Z_L$. In other words, the adjustment of the signal transmission line in the package is performed by adjusting the value of impedance $Z_T$ of the thick film resistance for producing the 50Ω impedance at the point c viewed from the point a in FIG. 4. The above-mentioned value of the adjusting impedance $Z_T$ can be calculated by simulating the signal transmission line in the package. Also, the impedance $Z_T$ can be set for a desired value by controlling parameters, such as the thickness and line width of the thick film resistance 9, the dielectric constant of the substrate 2, etc. Thus the signal reflection and waveform distortion can be reduced without decreasing the values of the parasitic inductance of the bonding wire 7 existing at the terminal of the signal transmission line in the package, the parasitic inductance of the wiring in the semiconductor chip 5, etc. or arranging any load resistance for adjusting impedance at the terminal mentioned above, and the frequency band of transmission of signal frequencies in the package can be made higher, i.e., expanded.

Figure 5:
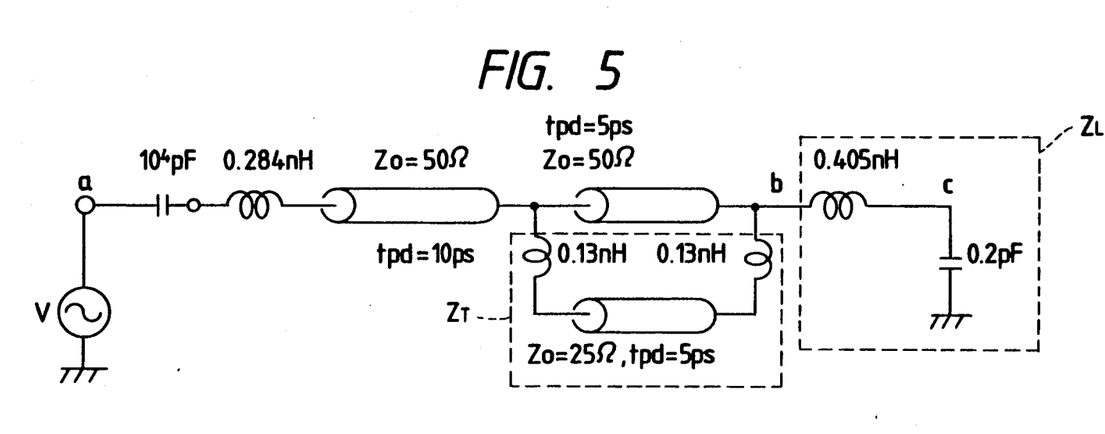
Figure 8:
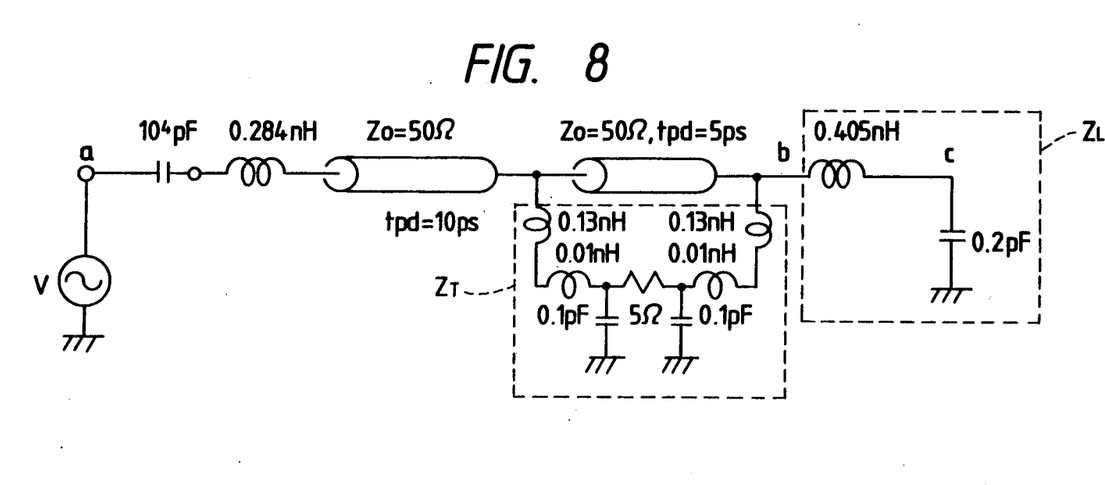
FIG. 8 is a circuit diagram showing the transmission line in the package of this semiconductor integrated circuit device.

For example, in FIG. 5 and FIG. 8, specific examples of values are shown for the package input parasitic impedance $Z_i$ in the signal transmission line in the package of this embodiment 1, the characteristic impedance $Z_0$ of the package wiring 6, the impedance $Z_T$ of the thick film resistance 9 and the terminal impedance $Z_L$.

Figure 15:
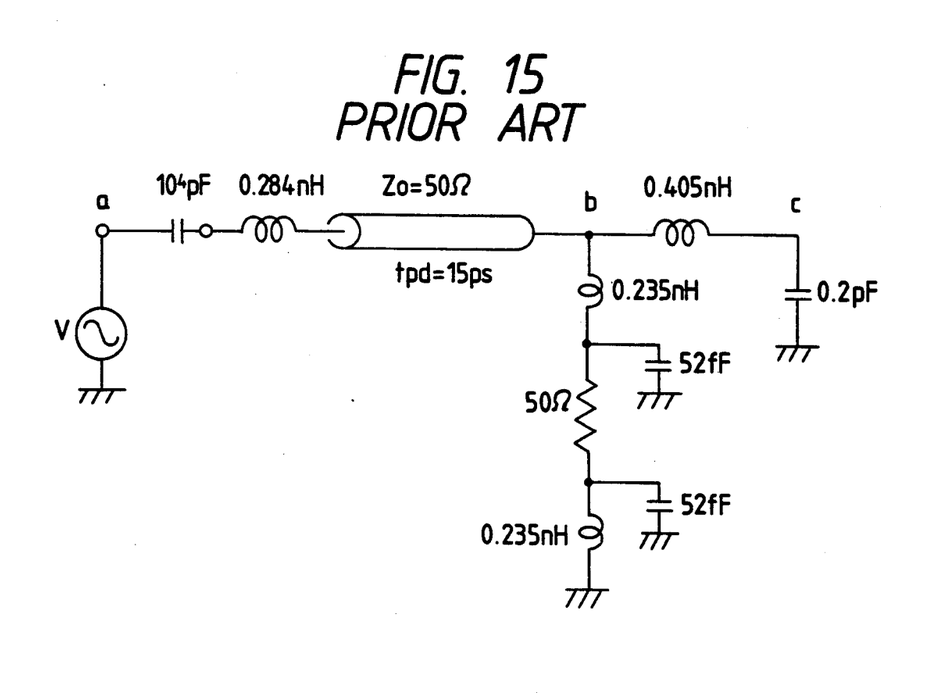

Here the values $Z_i$, $Z_0$ and $Z_L$ are set the same as the values of $Z_i$ ($10^4$ pF, 0.284 nH), $Z_0$ (50Ω), and $Z_L$ (0.2 pF, 0.405 nH) in the signal transmission line in the package according to the conventional art shown in FIG. 15 mentioned earlier. The curved line with the mark in FIG. 6 mentioned earlier shows the mismatching degrees of impedances in the package signal transmission line in the above-mentioned specific example, which are represented as the voltage standing wave ratios at the point c in FIG. 4. As clearly seen in the figure, if, for example, the standard of the voltage standing wave ratios is set to be 1.2, a maximum signal frequency that can be transmitted to the signal transmission line in the package of this embodiment 1 is approximately 7.5 GHz, which shows a significant improvement as compared with the prior art of approximately 3.5 GHz.

As set forth above, the IC package 1 of this embodiment 1 in which the thick film resistance 9 is connected in parallel to the package wiring 6, and the value of its impedance $Z_T$ is adjusted in accordance with the value of the parasitic impedance $Z_L$ existing at the terminal of the signal transmission line in the package. Hence the band of the signal frequency transmitted to the signal transmission line in the package can be made higher, making it possible to perform the switching action of the logical integrated circuit formed in the semiconductor chip 5 at a higher speed. Furthermore, according to this embodiment 1, the impedance of the signal transmission line in the package can be adjusted only by adjusting the impedance $Z_T$ of the thick film resistance 9 even in the case where the length of the bonding wire 7 should be modified due to the difference in sizes of the semiconductor chip 5. Thus the versatility of an IC package is enhanced because different kinds of superhigh speed devices can be mounted in one kind of IC package.

Embodiment 2)

Figure 7:
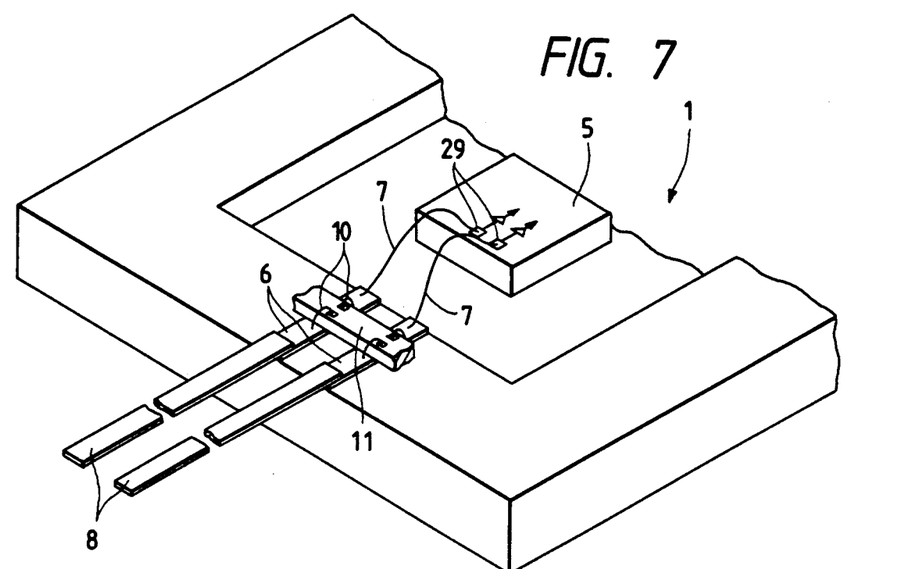
FIG. 7 is a perspective view showing the principle part of a semiconductor integrated circuit device according to another embodiment of the present invention.

FIG. 7 is a partial view showing the feature of an IC package 1 according to an embodiment 2 of the present invention. As shown in this figure, a second semiconductor chip 11 with a given impedance $Z_T$ is arranged on the package wiring 6 formed on the outer circumference of the substrate 2. The above-mentioned semiconductor chip 11 is connected in parallel to the package wiring 6 through the bonding wire 10 made of Au for example. The semiconductor chip 11 is made of GaAs for example, and the value of the impedance $Z_T$ is produced by the resisting element and wirings (not shown) formed on its main face. In other words, according to this embodiment 2, the mismatching ($Z_L/Z_0$) between the characteristic impedance of the above-mentioned package wiring 6 and the terminal impedance mentioned above is compensated for by adjusting the value of impedance $Z_T$ of the above-mentioned semiconductor chip 11 in accordance with the value of the terminal impedance $Z_L$ of the signal transmission line in the package. The impedance $Z_T$ mentioned above can be produced for a desired value by controlling parameters, such as resistive element, wiring, etc., formed on the semiconductor chip 11. Thus the signal reflection and waveform distortion can be reduced without decreasing the values of the parasitic inductance of the bonding wire 7 existing at the terminal of the signal transmission line in the package, the parasitic inductance of the wiring in the semiconductor chip 5, the input parasitic capacitance of the semiconductor chip 5, etc. or arranging any load resistance for adjusting the impedance at the above-mentioned terminal. Hence the same effect as in the case of the embodiment 1 can be obtained. Furthermore, the versatility of an IC package is enhanced because different kinds of superhigh speed devices can be mounted in one kind of IC package.

As set forth above, although the invention made by this inventor has been described specifically with reference to the embodiments, the present invention is not limited to said embodiments 1 and 2. It is readily understood that various modifications can be made within the range not departing the purport thereof.

Figure 9:
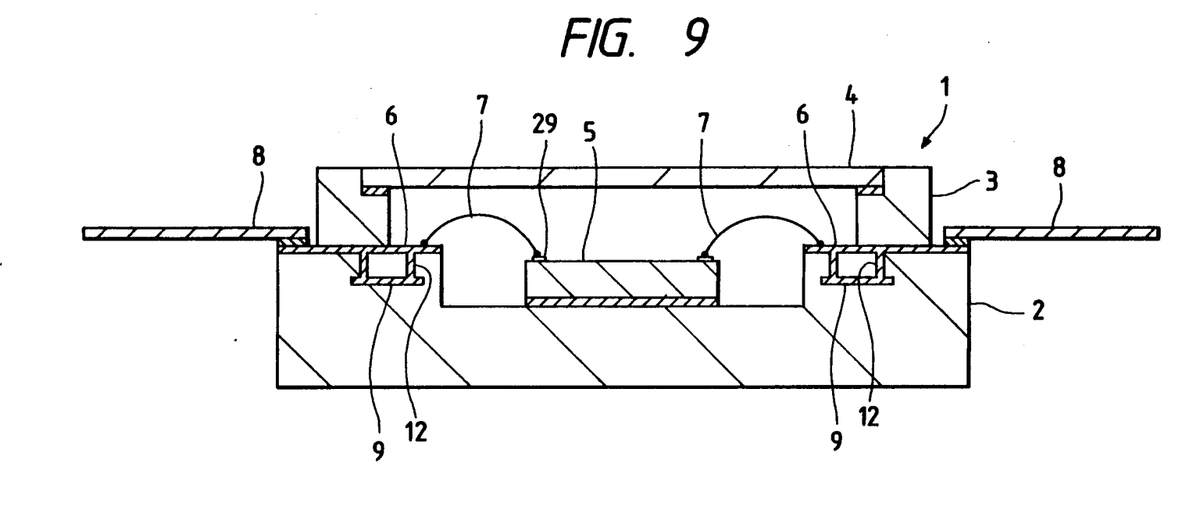
FIG. 9 is a perspective view showing the principle part of a semiconductor integrated circuit device according to still another embodiment of the present invention.

In said embodiment 1, although the thick film resistance producing the adjusting impedance $Z_T$ is formed on the same layer as the package wiring, the package wiring 6 and the thick film resistance 9 (adjusting impedance $Z_T$) can be formed on different layers of the substrate 2 comprising a plurality of layers as shown in FIG. 9 for example, and both of them can be connected in parallel through a through hole 12.

Figure 10:
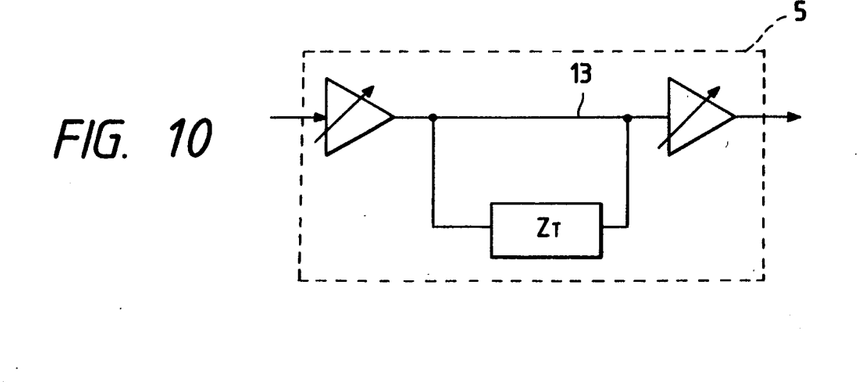
FIG. 10 is a perspective view showing the principle part of a semiconductor integrated circuit device according to still another embodiment of the present invention.

According to the description set forth above, the invention made by the present inventor is mainly described in the case of an application thereof to a technique for adjusting the impedance of the signal transmission line in the IC package which is the field of the industry behind the invention. However, the present invention is not limited only to such an application. For example, as shown in FIG. 10, a resistor element and others are arranged in parallel to a signal wiring 13 connecting between given circuits on a semiconductor chip 5 to produce impedance $Z_T$, and adjusting the value of this impedance $Z_T$ it is also possible to compensate for the mismatching between the characteristic impedance of the above-mentioned signal wiring 13 and the terminal impedance thereof. Furthermore, an adjusting impedance $Z_T$ can be provided in parallel to a signal wiring connecting between the semiconductor chips which are actually mounted on a wiring board, for example, thus making it also possible to compensate for the mismatching between the characteristic impedance of the above-mentioned signal wiring and its terminal impedance. Hence the present invention is applicable to the entire technique of adjusting the impedance of signal transmission line for superhigh speed devices.

I claim:

1. A semiconductor integrated circuit device comprising:
    a semiconductor chip having a logic circuit and a plurality of external terminals on a main face thereof;
    a package substrate with said semiconductor chip being mounted in a substantially central area thereof, said package substrate including an outer circumferential area which surrounds the central area thereof;
    a plurality of wirings formed on the outer circumferential area of said package substrate;
    a plurality of wires connecting said external terminals and wirings;
    a plurality of outer leads electrically connected to said wirings; and
    at least one resistance element formed in the vicinity of one wiring of said plurality of wirings,
    wherein said resistance element is electrically connected in parallel to said one wiring so as to adjust an effective characteristic impedance corresponding to said one wiring with respect to a terminal impedance corresponding to that comprising said one wiring, and an outer lead and wire electrically connected therewith.

2. A semiconductor integrated circuit device according to claim 1, wherein said resistance element is comprised of a thick film.

3. A semiconductor integrated circuit device according to claim 1, wherein said resistance element and said one wiring are connected by a wire.

4. A semiconductor integrated circuit device according to claim 1, wherein said resistance element is formed in said package substrate.

5. A semiconductor integrated circuit device according to claim 4, wherein said resistance element and said one wiring are connected through a through hole.

6. A semiconductor integrated circuit device according to claim 1, further comprising:
    a cap sealing said semiconductor chip.

7. A semiconductor integrated circuit device comprising:
    a first semiconductor chip having a logic circuit and a plurality of external terminals on a main face thereof;
    a package substrate with said first semiconductor chip being mounted in a substantially central area thereof, said package substrate including an outer circumferential area which surrounds the central area thereof;
    a plurality of wirings formed on the outer circumferential area of said package substrate;
    a plurality of wires connecting said external terminals and wirings;
    a plurality of outer leads electrically connected to said wirings; and
    a second semiconductor chip arranged on said wirings, said second semiconductor chip having resistance elements,
    wherein said second semiconductor chip is electrically connected in parallel to one wiring of said plurality of wirings so as to adjust the effective characteristic impedance corresponding to said one wiring with respect to a terminal impedance corresponding to that comprising said one wiring and an outer lead and write electrically connected therewith.

8. A semiconductor integrated circuit device for use in superhigh speed operation, comprising:
    a semiconductor chip of the GaAs type having a logic circuit and a plurality of external terminals on a main face thereof;
    a package substrate with said semiconductor chip being mounted in a substantially central area thereof, said package substrate including an outer area which surrounds the central area thereof;
    a plurality of wirings formed on the outer area of said package substrate;
    a plurality of wires each one connecting one of said external terminals to one of said wirings;
    a plurality of outer leads each one being connected to a respective one of said wirings; and
    at least one resistance element, each one thereof formed in the vicinity of a separate one of said plurality of wirings,
    wherein each of said at least one resistance element is electrically connected in parallel to a corresponding one of said wirings so as to adjust the effective characteristic impedance of the corresponding wiring connected therewith with respect to a terminal impedance corresponding to that comprising the corresponding wiring, and the outer lead and wire electrically connected therewith.

9. A semiconductor integrated circuit device according to claim 8, wherein each of said at least one resistance element is comprised of a thick film.

10. A semiconductor integrated circuit device according to claim 8, wherein each of said at least one resistance element and its corresponding wiring are connected by a wire.

11. A semiconductor integrated circuit device according to claim 8, wherein each of said at least one resistance element is formed in said package substrate.

12. A semiconductor integrated circuit device according to claim 11, wherein each of said at least one resistance element and its corresponding wiring are connected through a through hole.

13. A semiconductor integrated circuit device according to claim 8, further comprising a cap sealing said semiconductor chip.

14. A semiconductor integrated circuit device according to claim 2, further comprising a cap sealing said semiconductor chip.

15. A semiconductor integrated circuit device according to claim 3, further comprising a cap sealing said semiconductor chip.

16. A semiconductor integrated circuit device according to claim 5, further comprising a cap sealing said semiconductor chip.

17. A semiconductor integrated circuit device according to claim 10, further comprising a cap sealing said semiconductor chip.

* * * * *